(12) United States Patent
Feng et al.

(10) Patent No.: US 12,356,609 B2
(45) Date of Patent: Jul. 8, 2025

(54) BURIED BIT LINE STRUCTURE, METHOD FOR FABRICATING BURIED BIT LINE STRUCTURE, AND MEMORY

(71) Applicant: CHANGXIN MEMORY TECHNOLOGIES, INC., Hefei (CN)

(72) Inventors: Wei Feng, Hefei (CN); Jingwen Lu, Hefei (CN); Bingyu Zhu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 476 days.

(21) Appl. No.: 17/974,550

(22) Filed: Oct. 27, 2022

(65) Prior Publication Data

US 2023/0040873 A1 Feb. 9, 2023

(30) Foreign Application Priority Data

Nov. 9, 2021 (CN) .......................... 202111318131.0

(51) Int. Cl.
*H10B 12/00* (2023.01)
(52) U.S. Cl.
CPC .......... *H10B 12/482* (2023.02); *H10B 12/315* (2023.02)
(58) Field of Classification Search
CPC .......................... H10B 12/482; H10B 12/315
See application file for complete search history.

(56) References Cited

U.S. PATENT DOCUMENTS

| 11,233,057 | B2 * | 1/2022 | Wu | .................. H01L 21/76897 |
| 2015/0340453 | A1 * | 11/2015 | Cho | ...................... H10B 12/482 |
| | | | | 257/330 |
| 2021/0098460 | A1 * | 4/2021 | Lee | ...................... H10B 12/053 |

FOREIGN PATENT DOCUMENTS

CN 109411472 A 3/2019

* cited by examiner

*Primary Examiner* — Steven M Page
(74) *Attorney, Agent, or Firm* — Kilpatrick Townsend & Stockton LLP (57) ABSTRACT

Embodiments disclose a buried bit line structure, a method for fabricating the buried bit line structure, and a memory. The buried bit line structure includes: a substrate having a bit line trench; a bit line metal filled in the bit line trench; and a bit line contact filled in the bit line trench and positioned on the bit line metal, where an arc-shaped contact surface is provided between the bit line contact and the bit line metal. By setting a contact surface between the bit line contact and the bit line metal to be the arc-shaped contact surface, a contact area between the bit line contact and the bit line metal is increased, electrical conductivity of the bit line structure is enhanced.

10 Claims, 6 Drawing Sheets

BURIED BIT LINE STRUCTURE, METHOD FOR FABRICATING BURIED BIT LINE STRUCTURE, AND MEMORY

CROSS-REFERENCE TO RELATED APPLICATION

This application claims priority to Chinese Patent Application No. 202111318131.0, titled "BURIED BIT LINE STRUCTURE, METHOD FOR FABRICATING BURIED BIT LINE STRUCTURE, AND MEMORY" and filed to the State Patent Intellectual Property Office on Nov. 9, 2021, the entire contents of which are incorporated herein by reference.

TECHNICAL FIELD

Embodiments of the present disclosure relate to the field of semiconductor manufacturing, and more particularly, to a buried bit line structure, a method for fabricating the buried bit line structure, and a memory.

BACKGROUND

With miniaturization of processes for fabricating a semiconductor device, a bit line structure may also be miniaturized. It is needed to form a bit line trench having a smaller line width by means of photoetching to implement miniaturization of the bit line structure, the bit line structure in the prior art not only easily leads to inclination and collapse of material layers on the bit line trench, but also easily leads to damage and poor contact of these material layers, thus resulting in final failure of the semiconductor device.

Therefore, it is a technical problem to be solved to provide a bit line structure which is not easily damaged in a manufacturing process and has a large conductive contact area, and a method for manufacturing the bit line structure.

SUMMARY

A technical problem to be solved by embodiments of the present disclosure is to provide a buried bit line structure, a method for fabricating the buried bit line structure, and a memory.

To solve the above problem, the embodiments of the present disclosure provide a buried bit line structure, which includes: a substrate having a bit line trench; a bit line metal filled in the bit line trench; and a bit line contact filled in the bit line trench and positioned on the bit line metal, where an arc-shaped contact surface is provided between the bit line contact and the bit line metal.

The embodiments of the present disclosure also provide a method for fabricating the buried bit line. The method comprises: providing a substrate and forming a bit line trench in the substrate; filling a bit line metal in the bit line trench; and forming a bit line contact on the bit line metal, where an arc-shaped contact surface is provided between the bit line contact and the bit line metal.

The embodiments of the present disclosure also provide a memory, which comprises a buried bit line structure. The buried bit line structure comprises: a substrate having a bit line trench; a bit line metal filled in the bit line trench; and a bit line contact positioned on the bit line metal, where an arc-shaped contact surface is provided between the bit line contact and the bit line metal.

DETAILED DESCRIPTION

The buried bit line structure, the method for fabricating the buried bit line structure, and the memory provided by embodiments of the present disclosure are described in detail below with reference to the accompanying drawings.

Figure 1:
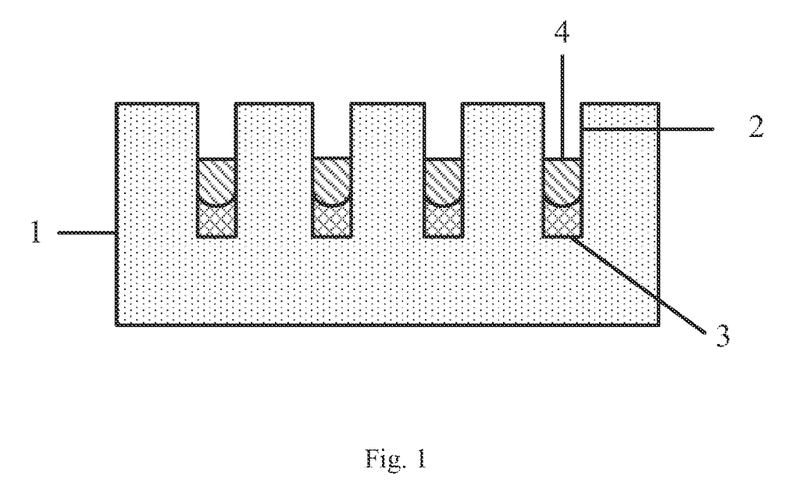
FIG. 1 is a schematic diagram of a buried bit line structure according to an embodiment of the present disclosure.

FIG. 1 is a schematic diagram of a buried bit line structure according to an embodiment of the present disclosure. The buried bit line structure comprises: a substrate 1 having a bit line trench 2: a bit line metal 3 filled in the bit line trench 2; and a bit line contact 4 filled in the bit line trench 2 and positioned on the bit line metal 3, where an arc-shaped contact surface is provided between the bit line contact 4 and the bit line metal 3. By increasing a contact area between the bit line contact 4 and the bit line metal 3, electrical conductivity of the bit line structure is enhanced.

In some embodiments, the substrate 1 may be, for example, a semiconductor substrate such as a Si substrate, a Ge substrate, a SiGe substrate, a silicon on insulator (SOI) substrate, or a germanium on insulator (GOI) substrate, etc. The semiconductor substrate may also be a substrate including other elemental semiconductors or compound semiconductors, such as GaAs, InP, or SiC, etc. The semiconductor substrate may also be a stack structure, such as Si/SiGe, etc. The semiconductor substrate may also be other epitaxial structures, such as silicon germanium on insulator (SGOI), and so on. The substrate 1 may be a single substrate structure, and of course may also include other semiconductor structures, such as buried word lines, isolation structures, doped structures, etc., which are not particularly limited and may be adjusted according to required structures.

In some embodiments, the bit line trenches 2 are a plurality of grooves formed by means of downward etching along the substrate 1. An etching width of each of these grooves may be 10 nm to 20 nm, such as 10 nm, 12 nm, or 18 nm. An etching depth of each of these grooves may be, for example, 1 to 2 times such as 1.5 times or 2 times the width of the groove. Further, for example, the etching depth when the bit line trench 2 is formed by means of downward etching may refer to that an insulating layer (not shown in the figure) on the substrate 1 such as the silicon (Si) substrate and the buried word line is etched downwards to a ½ to ⅗ position such as the ½ or ⅗ position of the insulating layer. Within the above range, the bit line metal 3 and the bit line contact 4 may be filled in the bit line trench 2 to form the buried bit line structure in the substrate 1. In this way, the height of the bit line structure is reduced, and the stability of the bit line structure is improved, which may avoid the collapse due to a greater height of a material layer on the bit line trench 2, extending outside the substrate 1 subsequently. A material of the bit line metal 3 may be, for example, tungsten, copper, aluminum, nickel, cobalt, etc. The bit line contact 4 leads out an electrical signal of the bit line metal 3. The bit line contact 4 may be, for example, tungsten and/or polysilicon.

Figure 2:
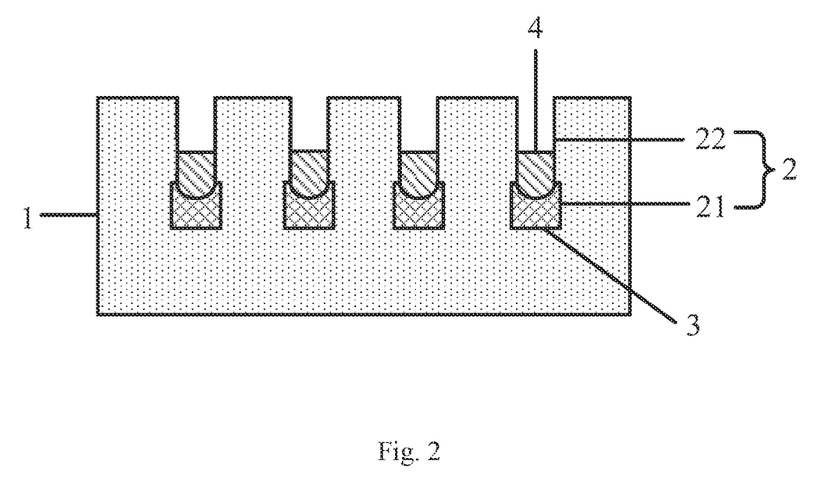
FIG. 2 is a schematic diagram of a buried bit line structure according to another embodiment of the present disclosure.

In some other embodiments, the width of the bit line metal is further expanded to avoid collapse of the material layer during the manufacturing processes. FIG. 2 is a schematic diagram of a buried bit line structure according to another embodiment of the present disclosure. The bit line trench 2 comprises: a first trench segment 21, where the bit line metal 3 is filled in the first trench segment 21; and a second trench segment 22, where the bit line contact 4 is filled in the second trench segment 22, the second trench segment 22 extends along a direction of the first trench segment 21, and a cross-sectional area of the second trench segment 22 is smaller than a cross-sectional area of the first trench segment 21. A projection of the bit line contact 4 on the substrate 1 is positioned within a projection of the bit line metal 3 on the substrate 1.

Figure 3:
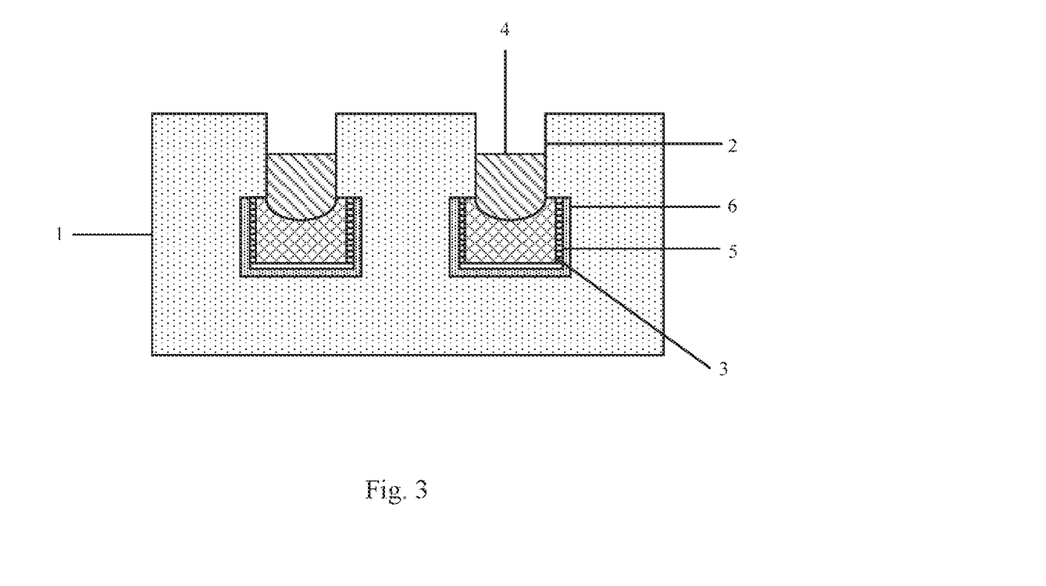
FIG. 3 is a schematic diagram of a buried bit line structure according to yet another embodiment of the present disclosure.

FIG. 3 is a schematic diagram of a buried bit line structure according to yet another embodiment of the present disclosure. The buried bit line structure comprises: a substrate 1 having a bit line trench 2; a bit line metal 3 filled in the bit line trench 2; and a bit line contact 4 filled in the bit line trench 2 and positioned on the bit line metal 3, where an arc-shaped contact surface is provided between the bit line contact 4 and the bit line metal 3. In this embodiment, the buried bit line structure further includes: a first barrier layer 6 positioned in the bit line trench, and a second barrier layer 5 positioned on a surface of the first barrier layer 6, where the bit line metal 3 covers a bottom wall and a side wall of the second barrier layer 5. The barrier layer 5 or the barrier layer 6 may be arranged to prevent the bit line metal 3 from diffusing to the substrate 1. A material of the first barrier layer 6 may be, for example, silicon oxide ($SiO_x$), silicon nitride (SiN), silicon oxynitride (SiON), and a low-dielectric-constant material. The second barrier layer 5 is positioned between the first barrier layer 6 and the bit line metal 3, and a material of the second barrier layer 6 may be other metal nitrides such as titanium nitride (TiN) or tantalum nitride (TaN).

Figure 4:
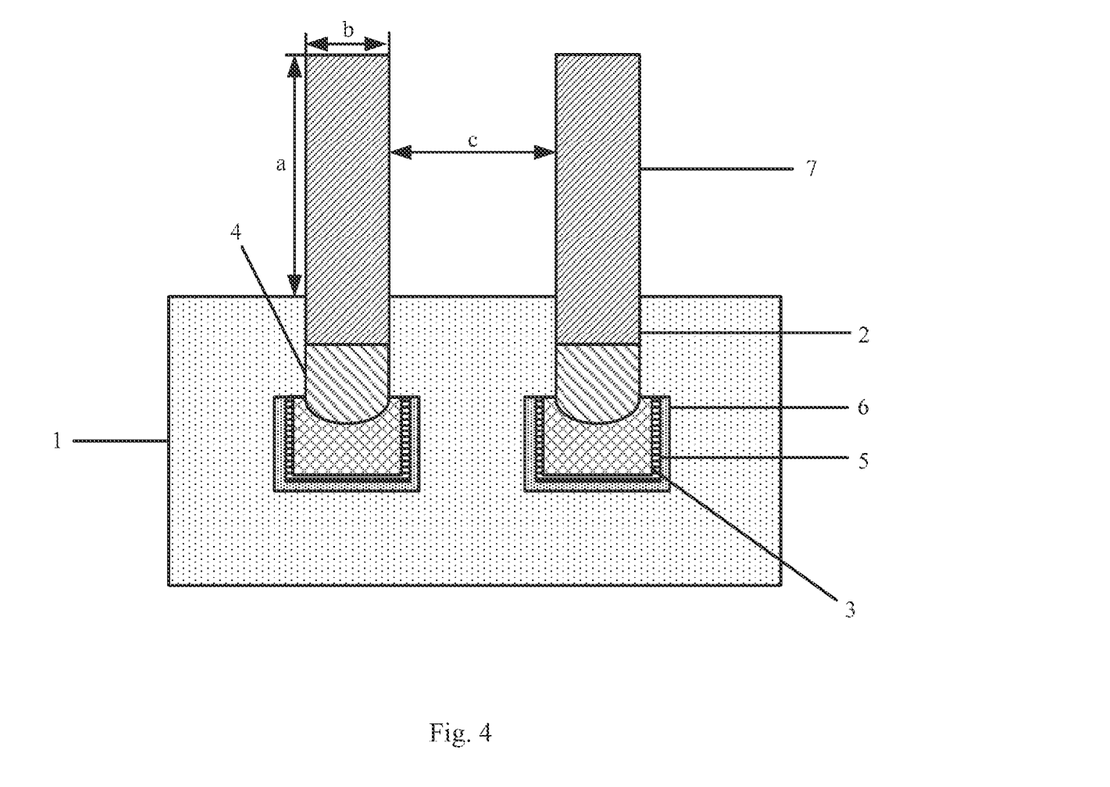
FIG. 4 is a schematic diagram of a buried bit line structure according to still another embodiment of the present disclosure.

FIG. 4 is a schematic diagram of a buried bit line structure according to still another embodiment of the present disclosure. The buried bit line structure comprises: a substrate 1 having a bit line trench 2: a bit line metal 3 filled in the bit line trench 2: a bit line contact 4 filled in the bit line trench 2 and positioned on the bit line metal 3, where an arc-shaped contact surface is provided between the bit line contact 4 and the bit line metal 3: a first barrier layer 6 positioned in the bit line trench; and a second barrier layer 5 positioned on a surface of the first barrier layer 6, where the bit line metal 3 covers a bottom wall and a side wall of the second barrier layer 5. In this embodiment, the buried bit line structure further comprises a spacer 7, which is filled in the bit line trench 2 and is positioned on the bit line contact 4. The spacer 7 at least partially extends outside the substrate 1, and the spacer 7 extends from inside the bit line trench 2 of the substrate 1 to outside the substrate 1. The spacer 7 serves as an isolation layer for subsequently fabricating a capacitor contact wire. A height of the spacer 7 extending outside the substrate 1 neither should be too small, to avoid adversely affecting the fabrication of the capacitor contact wire, nor should not be too large, to prevent inclination or collapse of the spacer 7 due to a greater height of the spacer 7. A height a of the spacer 7 extending outside the substrate 1 may be 3 to 8 times such as 4 times, 6 times, or 8 times a width b of the spacer 7, and further, the height a may be 1 to 2 times such as 1.5 times or 2 times a pitch c between two adjacent spacers 7. In some embodiments, the width of the spacer 7 is greater than or equal to the width of the bit line contact 4 positioned below the spacer. A material of the spacer 7 may be, for example, SiN. The spacer 7 may serve as the isolation layer for subsequently fabricating the capacitor contact wire.

In the above technical solutions, by setting the contact surface between the bit line contact 4 and the bit line metal 3 to be the arc-shaped contact surface, the contact area between the bit line contact 4 and the bit line metal 3 is increased, and thus the electrical conductivity of the bit line structure is enhanced. In some embodiments, expanding the width of the first trench segment 21 further expands the width of the bit line metal 3, thereby avoiding collapse of the spacer 7 during the manufacturing processes. The bit line structure which is not easy to damage in manufacturing processes and has a larger conductive contact area is provided to adapt to failure of the bit line structure due to the miniaturization of the bit line structure.

Figure 5:
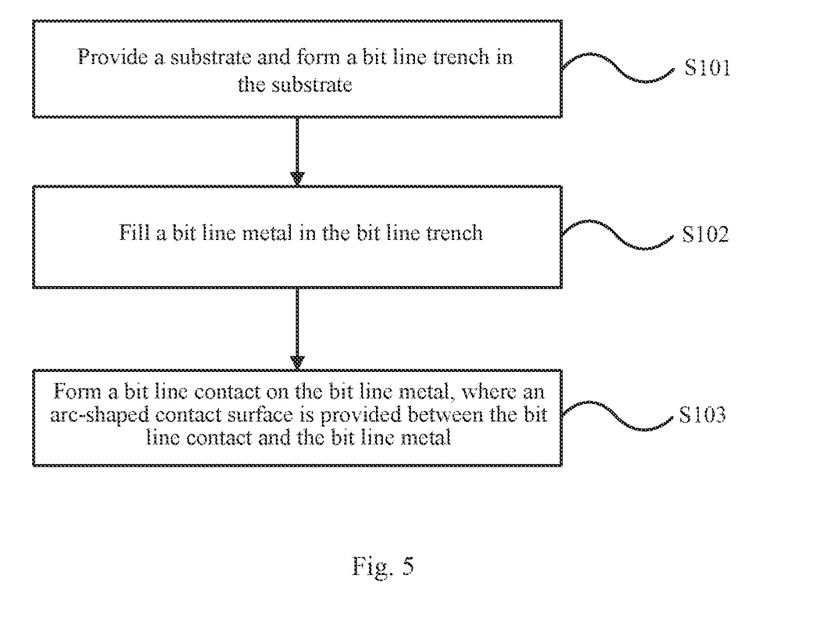
FIG. 5 is a schematic diagram of a method for fabricating a buried bit line structure according to an embodiment of the present disclosure.

FIG. 5 is a schematic diagram of a method for fabricating a buried bit line structure according to an embodiment of the present disclosure. The method for fabricating the buried bit line comprises: Step S101, providing a substrate 1 (shown in FIG. 4), and forming a bit line trench 2 in the substrate 1 (shown in FIG. 4): Step S102: filling a bit line metal 3 in the bit line trench 2 (shown in FIG. 4); and Step S103: forming a bit line contact 4 on the bit line metal 3 (shown in FIG. 4), where an arc-shaped contact surface is provided between the bit line contact 4 and the bit line metal 3.

Figure 6:
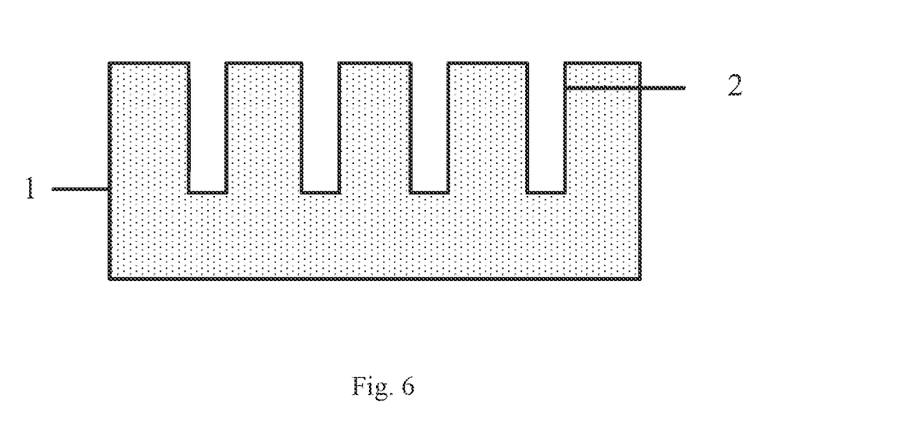
FIG. 6 is a schematic diagram of a bit line trench according to an embodiment of the present disclosure.

Referring to FIG. 5, in Step S101, a substrate 1 is provided, and a bit line trench 2 is formed in the substrate 1. FIG. 6 is a schematic diagram of a bit line trench 2 according to an embodiment of the present disclosure. Referring to FIG. 6, a substrate 1 is provided, and a mask layer (not shown in the figure) such as $SiO_2$ is formed on the substrate 1. The mask layer is patterned by means of a photolithography process, and the substrate 1 is continuously etched downward along the patterned mask layer, such that a bit line trench 2 is provided in the substrate 1, where the bit line trench 2 serves as a bit line conductive layer to connect the bit line metal 3.

Figure 7:
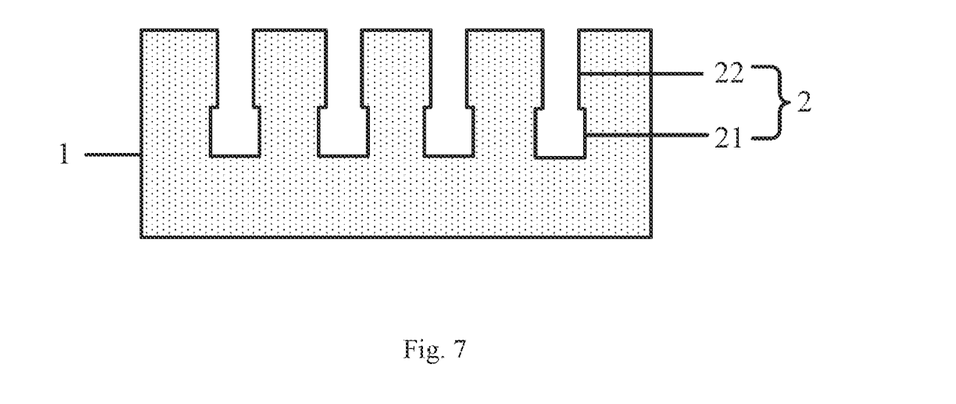
FIG. 7 is a schematic diagram of a bit line trench according to another embodiment of the present disclosure.

FIG. 7 is a schematic diagram of a bit line trench 2 according to another embodiment of the present disclosure. Referring to FIG. 7, before the filling the bit line metal 3 in the bit line trench 2, the method further comprises: expanding a portion of the bit line trench 2 and forming a first trench segment 21; and forming a second trench segment 22 on a remaining portion of the bit line trench 2, where the second trench segment 22 extends along a direction of the first trench segment 21, and a cross-sectional area of the second trench segment 22 is smaller than a cross-sectional area of the first trench segment 21. The bit line trench 2 includes the first trench segment 21 and the second trench segment 22.

The first trench segment 21 has a larger volume, such that it may be filled with more bit line metal 3. Moreover, the air gap is formed when the bit line metal 3 is filled, such that the arc-shaped surface may be formed by etching back the bit line metal 3 to the air gap, thereby improving the electrical conductivity. Furthermore, the wider spacer 7 may be formed by means of deposition via the first trench segment 21 and the second trench segment 22, thereby preventing the spacer 7 from collapsing due to a higher depth-to-width ratio.

Figure 8:
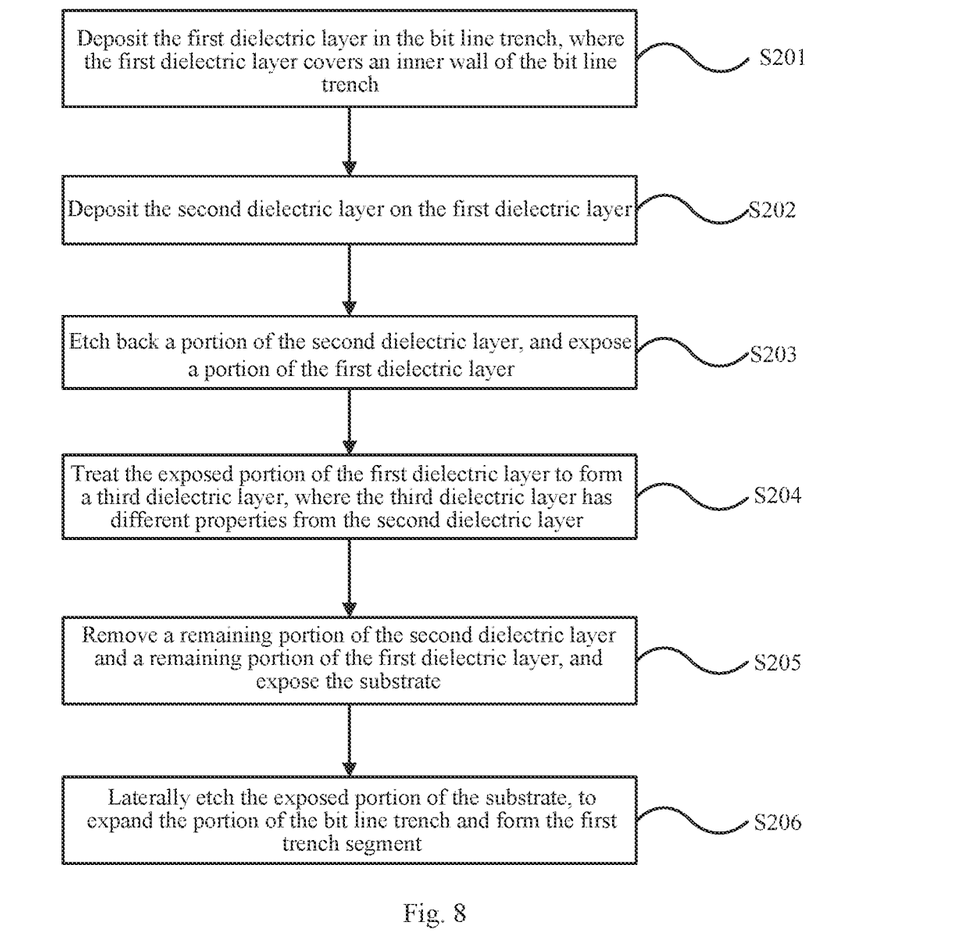
FIG. 8 is a schematic diagram of a method for forming a first trench segment according to an embodiment of the present disclosure.
Figure 9:
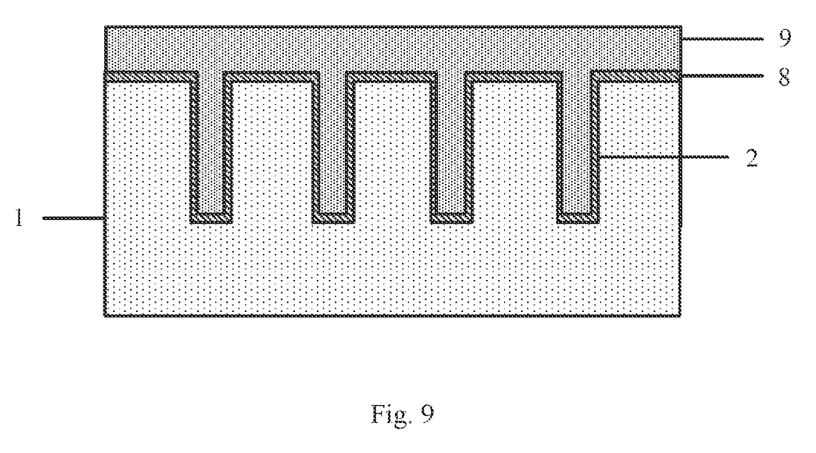
FIG. 9 is a schematic diagram of a first dielectric layer and a second dielectric layer according to an embodiment of the present disclosure.

FIG. 8 is a schematic diagram of a method for forming the first trench segment 21 according to an embodiment of the present disclosure. FIG. 9 is a schematic diagram of a first dielectric layer 8 and a second dielectric layer 9 according to an embodiment of the present disclosure. Referring to FIG. 8 and FIG. 9, the expanding the portion of the bit line trench 2 and forming the first trench segment 21 (shown in FIG. 7) comprises: Step S201, depositing the first dielectric layer 8 in the bit line trench 2, where the first dielectric layer 8 covers an inner wall of the bit line trench 2: Step S202, depositing the second dielectric layer 9 on the first dielectric layer 8: Step S203, etching back a portion of the second dielectric layer 9 and exposing a portion of the first dielectric layer 8: Step S204, treating the exposed portion of the first dielectric layer 8 to form a third dielectric layer 10, where the third dielectric layer 10 has different properties from the second dielectric layer 8: Step S205, removing a remaining portion of the second dielectric layer 9 and a remaining portion of the first dielectric layer 8, and exposing the substrate 1; and Step S206, laterally etching the exposed portion of the substrate 1 to expand the portion of the bit line trench 2 and form the first trench segment 21.

With continued reference to FIG. 8, in Step S201, the first dielectric layer 8 (shown in FIG. 9) is deposited in the bit line trench 2 (shown in FIG. 9), and the first dielectric layer 8 covers the inner wall of the bit line trench 2. In Step S202, the second dielectric layer 9 (shown in FIG. 9) is deposited on the first dielectric layer 8. Referring to FIG. 9, the substrate 1 has a bit line trench 2, and a first dielectric layer 8 is deposited in the bit line trench 2. In this embodiment, the first dielectric layer 8 may be, for example, a SiN layer, where a thickness of the SiN layer is for example 3 to 5 nm, such as 3 nm, and the first dielectric layer 8 covers the inner wall of the bit line trench 2. A second dielectric layer 9 is deposited on the first dielectric layer 8. In this embodiment, the first dielectric layer 8 and the second dielectric layer 9 are formed by means of an atomic layer deposition technique, where the second dielectric layer 9 may be a $SiO_2$ layer. The atomic layer deposition can accurately control the thickness of the first dielectric layer 8 and the thickness of the second dielectric layer 9. When the first dielectric layer 8 is within the above range, the substrate 1 may be effectively protected, and the subsequent processing of the first dielectric layer 8 may be ensured to completely obtain the third dielectric layer 10, thereby obtaining the bit line trench 2 having an expected shape.

Figure 10:
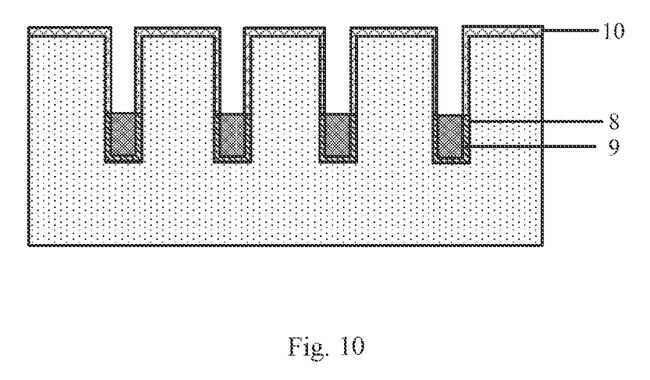
FIG. 10 is a schematic diagram of a third dielectric layer according to an embodiment of the present disclosure.

With continued reference to FIG. 8, in Step S203, a portion of the second dielectric layer 9 is etched back, and a portion of the first dielectric layer 8 is exposed. In Step S204, the exposed portion of the first dielectric layer 8 is treated to form a third dielectric layer 10 (shown in FIG. 10), where the third dielectric layer 10 has different properties from the second dielectric layer 9. The first dielectric layer 8 is formed into the third dielectric layer 10 having different properties from the first dielectric layer, such that the first trench segment 21 and the second trench segment 22 may be formed separately. In this case, the depth of the portion of the second dielectric layer 9 etched back may be a preset height of the bit line metal 2, i.e., the height of the first trench segment 21. FIG. 10 is a schematic diagram of the third dielectric layer 10 according to an embodiment of the present disclosure. Referring to FIG. 10, the portion of the second dielectric layer 9 is etched back and the exposed portion of the first dielectric layer 8 is treated to form the third dielectric layer 10. In this embodiment, the exposed portion of the first dielectric layer 8 is treated with oxygen plasma to form the third dielectric layer 10. The first dielectric layer 8 is nitride and is formed, via an oxidation reaction, into the third dielectric layer 10, which is a nitride oxide. For example, when the first dielectric layer 8 is silicon nitride, the third dielectric layer 10 is silicon oxynitride. In some embodiments, the temperature of the plasma oxygen reduction process is 800° C. to 900° C. such as 800° C. or 852° C., a plasma strength thereof is 600 W to 2,000 W such as 700 W or 1,200 W, and a pressure thereof is 1 Pa to 10 Pa such as 4 Pa or 8 Pa. In the above environment, the exposed portion of the first dielectric layer 8 may be fully oxidized into the third dielectric layer 10 having different properties. Of course, the treatment process used in the embodiment of the present disclosure is not limited thereto, for example, other suitable process such as high-temperature furnace tube oxidation, inert ion implantation, or nitriding may also be used. It should be understood that any process by which the first dielectric layer 8 may be treated to form the third dielectric layer 10 having the different properties should be included within the scope of protection of the present disclosure.

Figure 11:
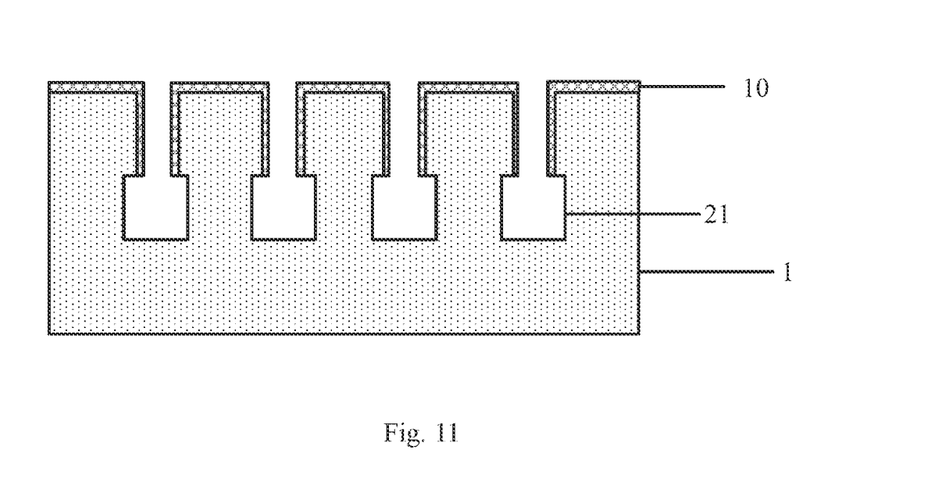
FIG. 11 is a schematic diagram of a first trench segment according to an embodiment of the present disclosure.

With continued reference to FIG. 8, in Step S205, a remaining portion of the second dielectric layer 9 and a remaining portion of the first dielectric layer 8 are removed, and the substrate 1 (shown in FIG. 11) is exposed. In Step S206, the exposed portion of the substrate 1 is laterally etched to expand the portion of the bit line trench 2 and form the first trench segment 21 (shown in FIG. 11). FIG. 11 is a schematic diagram of the first trench segment 21 according to an embodiment of the present disclosure. Referring to FIG. 11, the exposed portion of the substrate 1 is laterally etched to enlarge a portion of the bit line trench 2 and to form the first trench segment 21. In this case, a remaining portion of the bit line trench 2 serves as the second trench segment 22 (shown in FIG. 7). In some embodiments, the first dielectric layer 8 or the second dielectric layer 9 is removed by means of sulfur hexafluoride, carbon tetrafluoride, trifluoromethane, oxygen, argon, or a mixture of the above gases, where argon may be used as a protective gas during the etching process.

Figure 12:
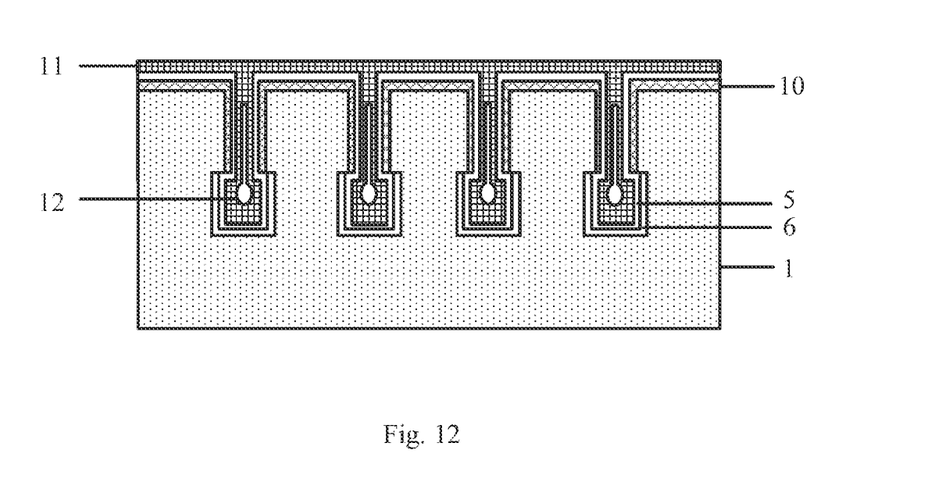
FIG. 12 is a schematic diagram of a first barrier layer and a second barrier layer according to an embodiment of the present disclosure.

Referring back to FIG. 5, in Step S102, the bit line trench 2 is filled with the bit line metal 3. FIG. 12 is a schematic diagram of a first barrier layer and a second barrier layer according to an embodiment of the present disclosure. Referring to FIG. 12, in some embodiments, before filling the bit line metal 3 in the bit line trench 2, the method further comprises: forming a first barrier layer 6 in the bit line trench 2, and/or, forming a second barrier layer 5 in the bit line trench 2, where the second barrier layer 5 is positioned on a surface of the first barrier layer 6, and the bit line metal 3 covers a bottom wall and a side wall of the second barrier layer 5. In some embodiments, the substrate 1 in the bit line trench 2 is nitrided to form the first barrier layer 6. The plasma nitriding gas used when nitriding the substrate 1 is the ammonia at the temperature of 600° C. to 800° C. such as 620° C. or 700° C., the plasma strength is 600 W to 2,000 W such as 600 W or 720 W, and the pressure is 1 Pa to 10 Pa such as 3 Pa or 7 Pa. In some other embodiments, the portion of the substrate 1 may also be oxidized to form the silicon oxide material as the first barrier layer 6, and of course the first barrier layer 6 may also be formed directly by means of deposition. The second barrier layer 5 continues to be formed on the surface of the first barrier layer 6 by means of deposition, where the second barrier layer 5 may be, for example, a metal nitride layer. Of course, the second barrier layer 5 may be formed directly on the surface of the substrate 1 without arranging the first barrier layer 6.

With continued reference to FIG. 12, in some embodiments, the filling the bit line metal 3 in the bit line trench 2 comprises: filling a metal material 11 in the first trench segment 21 and the second trench segment 22 of the bit line trench 2, where an air gap 12 is provided in the metal material 11 filled; and etching back a portion of the metal material 11 to the air gap 12, such that a remaining portion of the metal material 11 has an arc-shaped surface, where the remaining portion of the metal material 11 constitutes the bit line metal 3, as shown in FIG. 3 for example. In the embodiments of the present disclosure, the bit line trench 2 has the structure that is narrower at the top and wider at the bottom, such that the air gap 12 is formed in the process of depositing the metal material 11. During control of etching back, the air gap may be exposed, such that the surface of the bit line metal 3 finally formed is a concave circular surface. In this way, a larger contact area is provided between the bit line contact 4 formed subsequently and the conductive metal 3 therebelow; which is advantageous to improving the electrical conductivity:

Referring back to FIG. 5, in Step S103, the bit line contact 4 is formed on the bit line metal 3, where an arc-shaped contact surface is provided between the bit line contact 4 and the bit line metal 3. With continued reference to FIG. 12 and FIG. 3, after removing the upper metal material 11 and simultaneously removing the third dielectric layer 10 on the side wall, a bit line contact 4 continues to be deposited on the bit line metal 3, where the bit line contact 4 is electrically conductive between the bit line metal 3 and the substrate 1. In some embodiments, for example, the bit line contact 4 may be made of a polysilicon material. For example, by means of a low-pressure chemical vapor deposition (LPCVD), a reaction gas may be silane ($SiH_4$) and hydrogen phosphide ($PH_3$) for doped deposition at the temperature of 480° C. to 520° C. such as 500° C. By mixing the $SiH_4$ and the $PH_3$, the P-doped polysilicon is formed by means of LPCVD thermal composition. In this way, the bit line contact 4 formed may be electrically conductive.

In some embodiments, the method for fabricating the buried bit line structure further comprises: forming a spacer 7 (shown in FIG. 4), where the spacer 7 is filled in the bit line trench 2 (shown in FIG. 4) and is positioned on the bit line contact 4 (shown in FIG. 4), and the spacer 7 at least partially extends into the substrate 1 (shown in FIG. 4). FIG. 4 is a schematic diagram of a buried bit line structure according to an embodiment of the present disclosure. Referring to FIG. 4, the buried bit line structure comprises: a substrate 1 having a bit line trench 2: a bit line metal 3 filled in the bit line trench 2: a bit line contact 4 filled in the bit line trench 2 and positioned on the bit line metal 3, where an arc-shaped contact surface is provided between the bit line contact 4 and the bit line metal 3: a first barrier layer 6 positioned in the bit line trench; and/or a second barrier layer 5 positioned on a surface of the first barrier layer 6, where the bit line metal 3 covers a bottom wall and a side wall of the second barrier layer 5. In this embodiment, the buried bit line structure further includes a spacer 7 filled in the bit line trench 2 and positioned on the bit line contact 4, where the spacer 7 at least partially extends outside the substrate 1. The bit line contact 4 in the bit line trench 2 does not completely fill the second trench segment 22 of the bit line trench 2 or the portion of the bit line contact 4 is etched back, such that the insulating material such as the SiN material is deposited in the remaining portion of the bit line trench 2, where the SiN material may also be formed in the trench whose mask layer is not shown above. After the mask layer above is removed, the spacer 7 is formed, as shown in FIG. 4. Next, for example, a side wall layer (not shown in the figure) such as SiN—$SiO_2$—SiN may be formed on the surface of the spacer 7. Because a material of the SiN—$SiO_2$—SiN structure has the characteristic of low dielectric constant, it may be employed to fabricate the side wall having the low dielectric constant to enhance anti-breakdown capability of the side wall.

In the above technical solutions, by setting the contact surface between the bit line contact 4 and the bit line metal 3 to be the arc-shaped contact surface, the contact area between the bit line contact 4 and the bit line metal 3 is increased, and thus the electrical conductivity of the bit line structure is enhanced. In some embodiments, expanding the width of the first trench segment 21 further expands the width of the bit line metal, thereby avoiding collapse of the bit line structure in a subsequent etching process. The bit line structure which is not easy to damage in manufacturing processes and has a larger conductive contact area is provided to adapt to failure of the bit line structure due to the miniaturization of the bit line structure.

The embodiments of the present disclosure also provide a memory, which comprises a buried bit line structure. The buried bit line structure comprises: a substrate having a bit line trench: a bit line metal filled in the bit line trench; and a bit line contact positioned on the bit line metal, where an arc-shaped contact surface is provided between the bit line contact and the bit line metal.

In the above technical solutions of the present disclosure, by setting the contact surface between the bit line contact and the bit line metal to be the arc-shaped contact surface, the contact area between the bit line contact and the bit line metal is increased, and thus the electrical conductivity of the bit line structure is enhanced. In some embodiments, expanding the width of the first trench segment further expands the width of the bit line metal, thereby avoiding collapse of the bit line structure in a subsequent etching process. The bit line structure which is not easy to damage in manufacturing processes and has a larger conductive contact area is provided to adapt to failure of the bit line structure due to the miniaturization of the bit line structure, thereby reducing failure and damage of the memory caused by the failure of the bit line structure, and prolonging service life of the memory.

What is mentioned above merely refers to some embodiments of the present disclosure. It is to be pointed out that to those of ordinary skill in the art, various improvements and embellishments may be made without departing from the principle of the present disclosure, and these improvements and embellishments are also deemed to be within the scope of protection of the present disclosure.

What is claimed is:
1. A method for fabricating a buried bit line structure, comprising:
providing a substrate and forming a bit line trench in the substrate;
filling a bit line metal in the bit line trench; and forming a bit line contact on the bit line metal, an arc-shaped contact surface being provided between the bit line contact and the bit line metal.

2. The method for fabricating the buried bit line structure according to claim 1, wherein before the filling the bit line metal in the bit line trench, the method further comprises:
expanding a portion of the bit line trench and forming a first trench segment; and
forming a second trench segment on a remaining portion of the bit line trench, the second trench segment extending along a direction of the first trench segment, a cross-sectional area of the second trench segment being smaller than a cross-sectional area of the first trench segment.

3. The method for fabricating the buried bit line structure according to claim 2, wherein the expanding the portion of the bit line trench and forming the first trench segment comprises:
depositing a first dielectric layer in the bit line trench, the first dielectric layer covering an inner wall of the bit line trench;
depositing a second dielectric layer on the first dielectric layer;
etching back a portion of the second dielectric layer and exposing a portion of the first dielectric layer;
treating the exposed portion of the first dielectric layer to form a third dielectric layer, the third dielectric layer having different properties from the second dielectric layer;
removing a remaining portion of the second dielectric layer and a remaining portion of the first dielectric layer, and exposing the substrate; and
laterally etching the exposed portion of the substrate to expand the portion of the bit line trench and form the first trench segment.

4. The method for fabricating the buried bit line structure according to claim 3, wherein the exposed portion of the first dielectric layer is treated with oxygen plasma to form the third dielectric layer, the first dielectric layer being silicon nitride, and the third dielectric layer being silicon oxynitride.

5. The method for fabricating the buried bit line structure according to claim 2, wherein the filling the bit line metal in the bit line trench comprises:
filling a metal material in the first trench segment and the second trench segment of the bit line trench, an air gap being provided in the metal material filled; and
etching back a portion of the metal material to the air gap, such that a remaining portion of the metal material has an arc-shaped surface, wherein the remaining portion of the metal material constitutes the bit line metal.

6. The method for fabricating the buried bit line structure according to claim 2, wherein before the filling the bit line metal in the bit line trench, the method further comprises:
forming a first barrier layer in the bit line trench, and/or,
forming a second barrier layer in the bit line trench, the second barrier layer being positioned on a surface of the first barrier layer, the bit line metal covering a bottom wall and a side wall of the second barrier layer.

7. The method for fabricating the buried bit line structure according to claim 6, wherein the substrate in the bit line trench is nitrided to form the first barrier layer.

8. The method for fabricating the buried bit line structure according to claim 7, wherein a plasma nitriding gas used when nitriding the substrate is ammonia at a temperature of 600° C. to 800° C.

9. The method for fabricating the buried bit line structure according to claim 3, wherein the first dielectric layer or the second dielectric layer is removed by means of sulfur hexafluoride, carbon tetrafluoride, trifluoromethane, oxygen, argon, or any combination thereof.

10. The method for fabricating the buried bit line structure according to claim 1, further comprising: forming a spacer filled in the bit line trench and positioned on the bit line contact, wherein the spacer at least partially extends outside the substrate.

* * * * *